United States Patent
Bauer et al.

(10) Patent No.: US 9,382,110 B2
(45) Date of Patent: Jul. 5, 2016

(54) COMPONENT AND METHOD FOR PRODUCING A COMPONENT

(75) Inventors: Christian Bauer, Munich (DE); Hans Krueger, Munich (DE); Juergen Portmann, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/818,916

(22) PCT Filed: Jul. 29, 2011

(86) PCT No.: PCT/EP2011/063127
§ 371 (c)(1),
(2), (4) Date: Apr. 29, 2013

(87) PCT Pub. No.: WO2012/025334
PCT Pub. Date: Mar. 1, 2012

(65) Prior Publication Data
US 2013/0214405 A1  Aug. 22, 2013

(30) Foreign Application Priority Data

Aug. 25, 2010  (DE) .......................... 10 2010 035 390
Apr. 20, 2011  (DE) .......................... 10 2011 018 296

(51) Int. Cl.
*H01L 21/00* (2006.01)
*B81B 7/00* (2006.01)
*B81C 1/00* (2006.01)

(52) U.S. Cl.
CPC .......... *B81B 7/0077* (2013.01); *B81C 1/00269* (2013.01); *B81C 1/00333* (2013.01); *B81B 2207/093* (2013.01); *B81C 2203/0109* (2013.01); *B81C 2203/0118* (2013.01); *H01L 2224/16225* (2013.01); *H01L 2224/8114* (2013.01); *H01L 2924/1461* (2013.01)

(58) Field of Classification Search
None
See application file for complete search history.

(56) References Cited

U.S. PATENT DOCUMENTS

| | | | | |
|---|---|---|---|---|
| 6,078,123 | A * | 6/2000 | Tanaka | G01N 29/022 310/313 R |
| 7,102,224 | B2 * | 9/2006 | Pahl | B81B 7/007 257/620 |
| 7,270,850 | B2 * | 9/2007 | Krotz | B01D 67/003 204/400 |
| 7,743,963 | B1 | 6/2010 | Chung | |
| 2005/0242420 | A1 * | 11/2005 | Matsuda | H03H 9/0071 257/684 |
| 2006/0033188 | A1 * | 2/2006 | Chen et al. | 257/678 |
| 2006/0191215 | A1 * | 8/2006 | Stark | 52/204.6 |
| 2006/0267178 | A1 * | 11/2006 | Metzger | B81B 7/007 257/698 |
| 2007/0190691 | A1 | 8/2007 | Humpston et al. | |
| 2007/0222056 | A1 * | 9/2007 | Bauer | B81C 1/0023 257/687 |
| 2009/0029152 | A1 * | 1/2009 | Yun | B81C 1/00269 428/328 |
| 2010/0058585 | A1 * | 3/2010 | Remizov et al. | 29/846 |
| 2010/0087024 | A1 * | 4/2010 | Hawat et al. | 438/51 |
| 2010/0127377 | A1 * | 5/2010 | Bauer | B81B 7/0058 257/690 |

FOREIGN PATENT DOCUMENTS

| | | |
|---|---|---|
| DE | 10 2007 025 992 A1 | 12/2008 |
| JP | 08306738 A | 11/1996 |
| JP | 10256279 A | 9/1998 |

(Continued)

*Primary Examiner* — Benjamin Sandvik
*Assistant Examiner* — Herve Assouman
(74) *Attorney, Agent, or Firm* — Slater Matsil, LLP

(57) ABSTRACT

A component includes a substrate, a chip and a frame. The frame is bonded to the substrate and the chip rests on the frame. A sealing layer on parts of the frame and the chip is designed to hermetically seal a volume enclosed by the substrate, the chip and the metal frame.

7 Claims, 3 Drawing Sheets

(56) References Cited

FOREIGN PATENT DOCUMENTS

| | | | |
|---|---|---|---|
| JP | 11026645 A | 1/1999 |
| JP | 2001110845 A | 4/2001 |
| JP | 2007274104 A | 10/2007 |
| JP | 2009278562 A | 11/2009 |
| WO | WO 2006/052763 A2 | 5/2006 |

* cited by examiner

COMPONENT AND METHOD FOR PRODUCING A COMPONENT

This patent application is a national phase filing under section 371 of PCT/EP2011/063127, filed Jul. 29, 2011, which claims the priority of German patent application 10 2010 035 390.6, filed Aug. 25, 2010, and German patent application 10 2011 018 296.9, filed Apr. 20, 2011, each of which is incorporated herein by reference in its entirety.

TECHNICAL FIELD

The invention relates to a component and a method for producing a component.

BACKGROUND

Components of the type of a microelectromechanical system (MEMS), a microelectro-optical system (MEOPS), or a microelectro-optomechanical system (MEOMS), have a chip which has function carriers connected to conductor tracks and is mounted on a carrier substrate. The functionality of a surface acoustic wave filter chip is achieved by virtue of the fact that an electroacoustic transducer transforms electrical input signals into acoustic waves that propagate on the chip material, such as, for instance, on a monocrystalline piezoelectric substrate. The acoustic waves that occur in this case are called surface acoustic waves. If the acoustic waves propagate in the entire ensemble, then bulk acoustic waves are present. After corresponding signal processing by means of the acoustic waves, characteristic output signals can then be converted into electrical output signals again by means of a further transducer. Components which function according to this principle have outstanding filter or resonator properties. They are therefore predestined to be used in many technical fields such as wireless communication and sensor technology.

For disturbance-free propagation of the acoustic waves, it is necessary to implement various protection mechanisms. A housing and a cavity offer mechanical protection. In addition, a functioning component requires protection against environmental influences, such as temperature and moisture. For this reason, an encapsulation of the elements is required. In particular, it is important to be able to operate the component even in the case of frequent thermocycles and at high temperatures. Methods for producing the component and its protection mechanisms should, in order to satisfy modern requirements, lead to a minimized structural size. Economic production associated with few process steps and low material consumption is also required in this context.

SUMMARY OF THE INVENTION

In one aspect, the present invention provides a component and a method for producing a component which requires few process steps.

In one embodiment, a component comprises a substrate, a chip and a frame, which is connected to the substrate and on which the chip bears. Preferably, the substrate is gastight and comprises ceramics, such as high temperature co-fired ceramic or HTCC or low temperature co-fired ceramic or LTCC. It is furthermore preferred for the chip to comprise quartz, lithium tantalate, lithium niobate or similar substances to carry functional elements, for example, transducers for surface or bulk acoustic waves. For this purpose, said chip comprises, for example, a piezoelectric material, electroacoustic transducers and suitable conductor tracks.

The frame on the substrate is preferably produced from copper, nickel, silver or a sequence of these metals and is connected to the substrate in a gastight manner. Other materials for the frame, such as ceramic, for instance, are likewise conceivable. The chip bears on the frame. Furthermore, it is preferred for the frame to have a planar surface, for example, by means of diamond milling. As a result, it is possible that, for example, a chip provided with bump connections bears uniformly on the frame after flip-chip mounting and collapsing of the bump connections in a subsequent reflow process and the gap between chip and metallic frame is virtually zero given correspondingly adapted frame heights, bump heights and collapsing. By applying pressure to the chip with molten bump connections and cooling below the melting point of the bumps with continuous application of pressure, the gap between chip and frame can likewise be minimized and be less than 10 nm in the case of diamond-milled frames.

A sealing layer between the frame and the chip is designed to hermetically seal a volume enclosed by the substrate, the chip and the frame. The residual gap between chip and frame can thus be sealed.

Advantageously, the component in the form of the enclosed volume or a cavity is hermetically sealed against environmental influences by using the sealing layer. By placing the chip onto the frame, it is furthermore possible to achieve the hermetic sealing of the cavity with few process steps. In this case, the sealing layer can be adapted to the specific use of the component in wide ranges. As a result, it is possible to optimize the behavior during thermocycles after the component has been mounted on substrates such as, for example, electronic printed circuit boards (PCB) or low temperature co-fired ceramics. Even after remolding of the mounted components with inclusion of further materials such as metallic foils, for example, the behavior during thermocycles can advantageously be improved. Furthermore, it is possible to realize reduced structural sizes of the chip whilst maintaining the filter functions. With a small number of required process steps, it is thus possible to achieve more components per panel with the same functionality or else to realize larger chips with the same panel occupancy.

In a further embodiment, the sealing layer constitutes a layer applied using inkjet technology or jet technology. In this case, the sealing layer comprises, after the jet process, a polymer or metal particles. A mixture of polymer and inorganic particles is also possible.

The sealing layer, or that is to say the polymer or the metal particles, is applied to the gap between the metal frame and the chip by means of inkjet printing technology or jetting. By means of the jet method, the sealing layer is applied in a positionally accurate manner. In this case, preferably, specific sections in the sealing layer are provided only with polymer or only with metal particles. In a further process step, during sealing or after sealing of the gap between metal frame and chip, the polymer or the metal particles can be cured. This is preferably done by irradiating the sealing layer using a UV laser or a suitable laser which thermally cures the material or thermally sinters it in the case of the metal particles. UV-curing polymers are preferably used.

Advantageously, a gastight and hermetic sealing layer can be realized using polymers or metal particles. In this case, the choice of the corresponding materials depends on the given application and the corresponding shielding requirements. In the case of use in mobile radio, for example, high-frequency radiation has to be shielded. If metal particles are used, for example, then they have, alongside gastight sealing, further properties such as, for example, electrical properties. As a result, for instance, excess charges such as typically occur on the chip can be carried away.

In a further embodiment, the sealing layer is formed by jetting of metallic nanoparticles having diameters of less than 10 nm and subsequent sintering thereof.

High-resolution positionally accurate sealing layers can be realized with the aid of the metallic nanoparticles, preferably silver nanoparticles or gold nanoparticles. Furthermore, it is possible, by means of thermal sintering using a laser, for example, to connect the nanoparticles to form an electrically conductive, gastight layer. In this case, it has been found that when using nanoparticles having diameters of less than 10 nm at sintering temperatures of approximately 200° C., a conductivity is established which corresponds approximately to one fifth of the electrical conductivity of the corresponding bulk material.

In a further embodiment, the sealing layer completely encompasses the frame around the chip and the sides of the chip. In this case, the sealing layer is applied by jetting, for example, in the form of a frame along the chip circumference by means of inkjet printing technology. Alternatively, the metal particles, preferably the metallic nanoparticles, can cover the complete outer chip surface and the frame. In this case, the sealing layer is applied by wide-band jetting, for example.

According to a further embodiment, the frame has a planar surface. The latter is fashioned homogeneously, for example, by diamond milling or other suitable prior processes, such that the chip bears uniformly or homogeneously on the frame. In this case, the surface of the frame is preferably so planar that a gap between metallic frame and chip is as small as possible or virtually zero.

Advantageously, the distance between the frame and the chip is virtually zero. This is achieved in the case of a planarized frame, for example, by means of sufficient collapsing of the bump connections in a reflow process or alternatively by uniform application of pressure to the chips in the molten state of the bump connections and cooling with application of pressure. Gaps between chip and frame that are smaller than 10 nm can thereby be achieved. Said gaps remain even after cooling if the coefficient of thermal expansion of the material of the bump connection is greater than that of the frame material. In that case, the metal particles, preferably metallic nanoparticles, can be applied by jetting and subsequently sintered by means of heat treatment to form homogeneous metal layers.

In a further embodiment, the chip is interconnected with the substrate via a bump connection.

By means of the bump connection, an electrical interconnection with the substrate arises and allows an electrical communication of the between chip and substrate.

According to a further embodiment, the bump connection has a coefficient of thermal expansion that is greater than a coefficient of thermal expansion of the frame.

The distance zero between chip and frame can also be achieved by applying pressure to the chip at soldering temperatures of the bump connection and cooling with application of pressure below the melting point of the bump connection. During further cooling, the chip is pressed onto the frame if the frame material has a lower coefficient of thermal expansion than the bump material. That is the case, for example, for Cu frames and solders composed of Sn alloys.

According to a further embodiment, the substrate and/or the chip have/has a functionalized surface.

The substrate and/or the chip can be functionalized at different points in time. The surface functionalization makes it possible to influence the wetting behavior of jetted materials, for example of nano-inks, in a targeted manner. This gives rise to possibilities for optimizing the flow behavior of the materials or material sections printed using jet technology. In this case, the droplet size used during jetting can be varied in accordance with the requirements in a wide range, for example, with droplet diameters in the range of 10 μm to 100 μm.

In a further embodiment, the functionalized surface comprises functional silane groups. A chemical linking of a silane compound to the surface is made possible in the course of silanization. Preferably, the properties of the coated surface or of the silane group used are chosen such that it has an adhesive effect relative to the metallic particles used.

According to a further embodiment, the sealing layer comprises in sections only the polymer, a doped polymer or sintered metal particles. Alternatively, the sealing layer comprises only the polymer or only the sintered metal particles.

Depending on the field of application or else cost stipulations, various process steps in the production of the component can be obviated. By applying the polymer or the metal particles in sections, it is possible to adapt the component to the customer requirements in wide ranges. It is thus possible, for example, to reduce mechanical stresses in the chip or the connection in a targeted manner.

In a further embodiment, the chip is a microelectromechanical system, a microelectro-optical system or a microelectro-optomechanical system.

One embodiment for producing a component comprising a substrate, a chip and a frame comprises the following steps: applying the frame to the substrate and connecting the chip to the frame. The connecting is effected in such a way that the chip is placed on the frame, and the connection between the chip and the frame is hermetically sealed.

Advantageously, an enclosed volume or a cavity of the component is hermetically sealed against environmental influences by the use of the sealing layer. By placing the chip onto the frame, it is furthermore possible to achieve the hermetic sealing of the cavity with few process steps. In this case, the sealing layer can be adapted to the specific use of the component in wide ranges. It is thus possible, for instance, to optimize the behavior during thermocycles after the component has been mounted for example on substrates, such as, for example, electrical printed circuit boards (PCB) or low temperature co-fired ceramics (LTCC). Even upon later remolding of the mounted components with inclusion of further materials such as additional metallic foils for electromagnetic shielding, the behavior during thermocycles after mounting can advantageously be improved. Furthermore, it is possible to realize reduced structural sizes and filter functions of the chip. Since the number of required process steps is small, it is possible to achieve more components per panel with the same functionality or else to realize larger chips with the same panel occupancy.

In a further embodiment, the sealing layer is applied by means of inkjet printing. In this case, the sealing layer comprises, during printing, a polymer or metal particles or a mixture of polymer and metal particles.

Advantageously, a gastight and hermetic sealing layer can be realized by using polymers or metal particles. In this case, the choice of the corresponding materials depends on the respectively given application. If metal particles are used, for example, then they have, alongside gastight sealing, further properties such as, for example, electrical properties. As a result, for instance, excess charges such as typically occur on the chip can be carried away or it is possible to prevent high-frequency radiation from emerging from the component. Preferably, the sealing layer is cured thermally by means of laser radiation, for example.

In a further embodiment, the method additionally comprises functionalizing the substrate, the chips, if appropriate also before the wafer is singulated.

By means of surface functionalization, the surfaces of the chips, of the substrate or of the wafer can be prepared for the use of the sealing layer. By way of example, when using the metal particles it is possible to achieve a wetting property, such that the particles suspended in liquid can be jetted in a positionally accurate manner. In this way, the sealing layer can be optimally applied and adapted in wide ranges.

According to a further embodiment, the functionalizing is effected by means of silanization.

By means of silanization, functional silane groups are chemically applied to surfaces. Said functional groups can subsequently produce advantageous wetting properties, in particular relative to suspended nano-metal particles.

According to a further embodiment, the sealing layer is applied by means of inkjet printing. This is alternatively effected in sections, wherein one section comprises only the polymer and one section comprises only metal particles. As an alternative, it is effected in such a way that the sealing layer comprises either only the polymer or only the metal particles.

In order to avoid mechanical stresses along the chip or substrate, it can be advantageous to provide sections of the sealing layer having different material compositions.

In a further embodiment, the chip is hermetically sealed with the metal frame in which the chip is connected and interconnected with application of pressure and by means of bump connections between the substrate and the chip.

BRIEF DESCRIPTION OF THE DRAWINGS

The invention is explained below on the basis of a number of exemplary embodiments with reference to figures. Insofar as parts or components correspond in terms of their function, the description thereof will not be repeated in each of the following figures.

DETAILED DESCRIPTION OF ILLUSTRATIVE EMBODIMENTS

Figure 1:
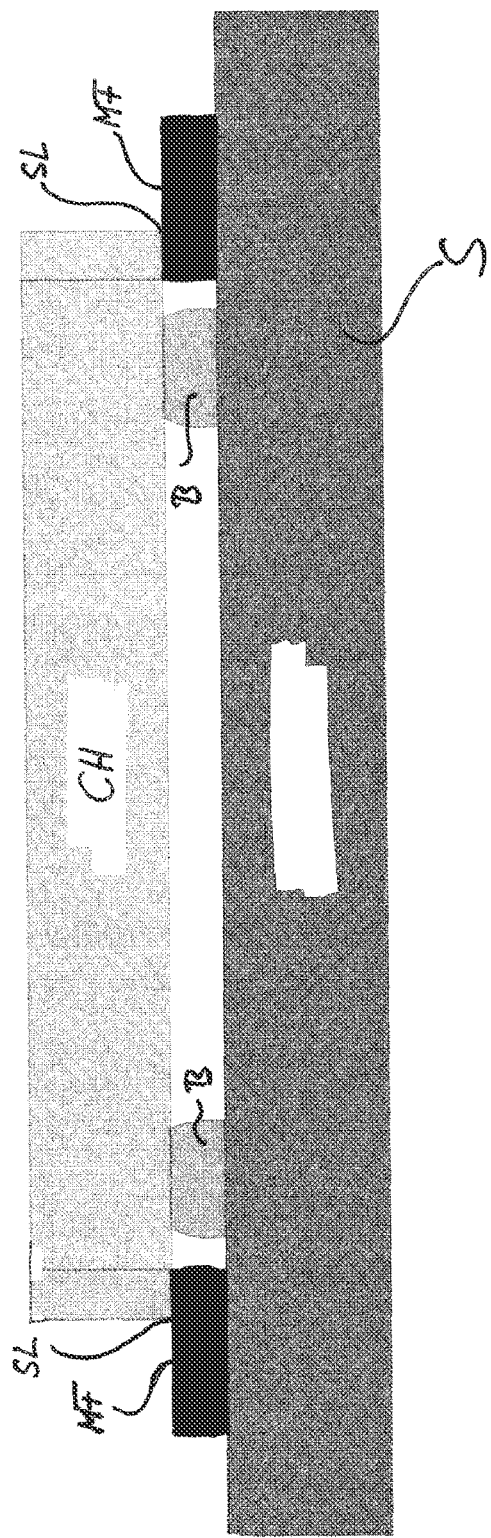
FIG. 1 shows an exemplary embodiment of a component according to the proposed principle.

FIG. 1 shows an exemplary embodiment of a component according to the proposed principle. It shows a component such as can be mounted on a substrate S or together with a plurality of similar components alongside one another on a panel. The component comprises the substrate S, on which a circumferentially extending metallic frame MF is situated. A chip CH bears on said frame MF, said chip additionally being electrically interconnected with the substrate S via bump connections B. Preferably, the metallic frame MF comprises copper or similar metals and has been milled in a planar fashion in a first processing step. This can be effected by diamond milling, for example. However, the frame can comprise other materials, such as ceramics, for example.

By means of application of pressure, the chip CH is connected to the metallic frame MF. For this purpose, firstly the chip CH can be soldered to the substrate S by means of bump connections B, wherein the temperatures used are above the melting point of the solder. The metallic frame MF is embodied at the surface such that the distance between chip CH and metallic frame MF is virtually zero. The component can be cooled with application of pressure being maintained. In this case, the chip is additionally pressed onto the metallic frame MF if the coefficient of thermal expansion of the bump connection B is chosen to be greater than the coefficient of thermal expansion of the metallic frame MF.

In an independent step, the chip CH was previously provided with conductor tracks allowing the chip CH to be used as a microelectromechanical or MEMS system or similar system. In order to reduce the required chip area of the chip CH, the chip can have conductor track crossovers. Benzocyclobutane (BCB) or other suitable plastics are to be provided as insulation layer between mutually crossing conductor tracks. The chip can also have a frame composed of the material of the mutually crossing conductor tracks, which frame bears on the frame MF after reflow soldering.

The chip CH bearing on the metallic frame MF forms together with the substrate S a cavity, that is to say an encompassed volume. The latter is necessary for the use of the chip CH with surface or bulk acoustic waves. For correct functioning of the chip CH for these applications, it is furthermore necessary for the enclosed cavity to be hermetically sealed, that is to say gastight and protected against environmental influences. For this purpose, a sealing layer SL is applied to the gap between metallic frame MF and chip CH, by which sealing layer the gap—already small anyway—between metallic frame MF and chip CH is further sealed and closed off in a gastight manner. In this way, it is possible for the chip surface situated in the cavity to be protected against contaminations.

Expediently, the sealing layer SL is applied by means of an inkjet printing technology—jet technology. Suitable materials comprise polymers P or metal particles NP. The latter are, for example, silver-filled nano-inks comprising silver nano-particles having diameters of less than 10 nm. These are not just suitable as hermetic sealing layer SL but, on account of their electrical properties, can also carry away excess charges at the chip CH or perform shielding functions.

Figure 2:
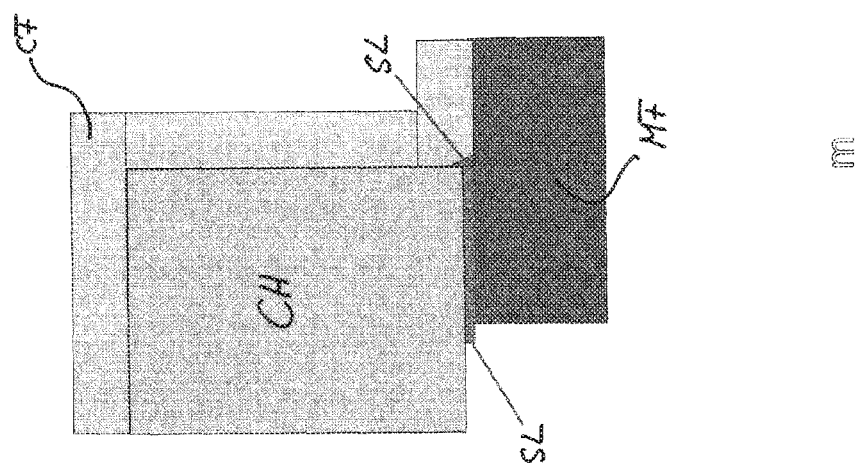
FIG. 2 shows a detail view of a sealing layer of a component according to the proposed principle.

FIG. 2 shows details of the sealing layer SL according to the proposed principle. The sealing layer SL can alternatively comprise only the polymer P or the metal particles NP. However, it is also conceivable to provide a mixture of both substances. The sealing layer SL is applied by means of inkjet printing technology or jetting along the chip circumference. The sealing layer SL prevents that chip surface of the chip CH which is situated in the cavity from being contaminated in subsequent process steps, and also during operation of the component. In order to reliably prevent a contamination of the inner chip surface when applying the sealing layer SL, it is appropriate, when using the suspended nano-metal particles NP, to functionalize the surfaces that come into contact with the sealing layer SL such that the metal particles, which are preferably suspended in organic solvents such as alcohols, do not impermissibly flow and adhere. One possibility is afforded by surface functionalization using suitable silane groups. Such surface functionalizations are chosen such that they are stable with respect to reflow temperatures of approximately 260° C. if functionalization was effected prior to the soldering of the chips CH to the panel.

The surface functionalization is effected for example prior to jetting and can alternatively be effected at the panel level, chip level and substrate level. It can, for example, also be effected using substrates that have already been equipped with chips CH. Depending on the aim of the application, this gives rise to corresponding combinations for optimizing the wetting behavior of the materials or material sections printed using jet technology. The droplet size used in inkjet printing technology can be varied in accordance with the requirements in a wide range, for example, in the range of 10 μm to 100 μm droplet diameter.

Once the sealing layer SL is applied, during sealing or after sealing of the gap between metallic frame MF and chip CH the applied polymer P is cured or the metallic particles MP are sintered together. This is possible for example by irradiating the sealing layer SL using a UV laser (UV-curing polymers) or else using a conventional laser, which thermally cures the sealing layer SL or thermally sinters it in the case of metallic particles.

Figure 3:
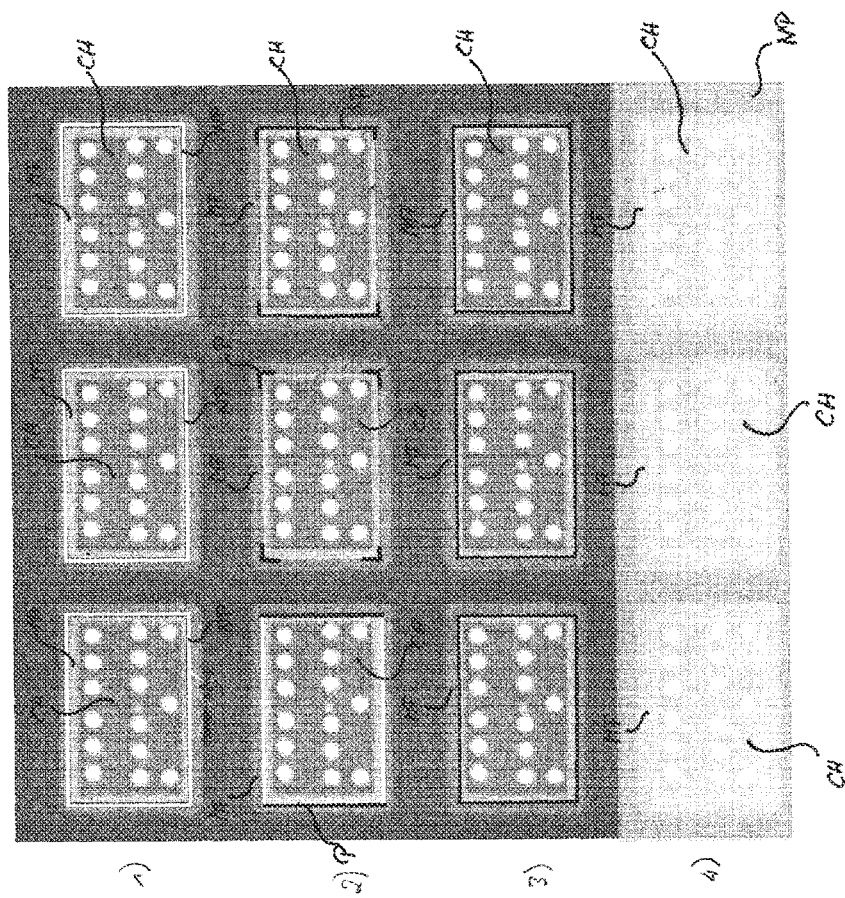
FIG. 3 shows exemplary embodiments having different sealing layers according to the proposed principle.

FIG. 3 shows alternative embodiments of a component according to the proposed principle. Four different embodiments 1, 2, 3 and 4 are shown, which respectively differ in the embodiment of the sealing layer SL.

In accordance with a first exemplary embodiment 1, the chips CH soldered with the bump connections B and also the substrate S are surface-functionalized separately beforehand. After the soldering of the chips CH, silver nanoparticles are jetted at an angle of approximately 45° onto the gap between metallic frame MF and chip CH and subsequently subjected to heat treatment. It may supplementarily be expedient to sputter a seed layer prior to the jetting of silver nanoparticles. As a further alternative, it is possible to functionalize wafer surfaces that have been provided with bump connections B and diced. The chips CH provided with bump connections B are exposed during grinding that is subsequently possible (dicing before grinding process or DBG). In this case, the chip CH is functionalized only at relevant surfaces; e.g., at the side surfaces or on the surface provided with bumps.

A second alternative consists in carrying out the surface functionalization of the substrate S provided with chips CH after reflow soldering in a reactor. This obviates separate processes for wafer W and substrate S and the soldered partners are functionalized only at relevant surfaces.

In a second embodiment 2 metal particles are jetted at the longitudinal sides of the chip CH and the polymer P is jetted on the narrow sides of the chip CH. Such a measure reduces mechanical stresses such as peel stresses, which occur in accordance with the chip geometry primarily at the edges during thermocycles and represent a potential risk of delamination. Embodiment 2 furthermore exhibits further modifications dependent on the coefficient of thermal expansion (CTE value) of the substrate S used. In this case, mechanical stresses can be influenced and reduced by jetting metal particles NP and/or polymers P in sections, for example, only at edges of the metallic frame MF.

A third embodiment is designated by the reference sign 3. In this case, the substrate S is completely surrounded by a jetted polymer frame. The polymer P used in this case can be either UV-curing, or thermally curing or a hot melt variant. In this example, a surface functionalization can be obviated if the polymer P has corresponding flow properties, for example, by means of UV irradiation during jetting or by means of application in the hot state onto a cold substrate surface.

The fourth embodiment shown comprises metal particles NP that are jetted onto the substrate S equipped with chips CH. In this case, the metal particles NP serve as a seal between metallic frame MF and chip CH. In addition, the metal particles NP serve as a seed layer for possible subsequent plating. Such a variant is particularly cost-effective since a series of others of processes from the other embodiments is obviated.

The components according to embodiments 1, 2, and 3 produced as above can, in a final step during production on a panel, be sawn from the latter and used as individual components. It is furthermore possible to overmold the components thus produced and/or to provide them with further protective layers or foils. Preferably, a metal layer is applied by means of plating.

The invention claimed is:

1. A method for producing a component comprising a substrate, a chip and a frame, the method comprising:
   applying the frame to the substrate;
   connecting the chip to the frame in such a way that the chip bears on the frame; and
   hermetically sealing the connection between the chip and the frame by a sealing layer, wherein the sealing layer is applied by inkjet printing in a positionally accurate manner directly between the frame and the chip after the chip has been connected to the frame, and wherein applying the sealing layer by inkjet printing is effected in sections, one section comprising only a polymer and one section comprising only metal particles.

2. The method according to claim 1, further comprising functionalizing surfaces of the substrate or of the chip or a panel equipped with chips in a targeted manner.

3. The method according to claim 2, wherein the functionalizing is effected by silanization.

4. The method according to claim 1, wherein the chip is hermetically sealed with the frame by the chip being connected with application of pressure by bump connections between the substrate and the chip.

5. The method according to claim 1, further comprising functionalizing surfaces of the substrate or of the chip or a panel equipped with chips in a targeted manner.

6. The method according to claim 5, wherein the functionalizing is performed by printing on metal particles suspended in a fluid.

7. The method according to claim 6, wherein the sealing layer comprises metal particles having a diameter of less than 10 nm.

* * * * *